(12) United States Patent
Tsai et al.

(10) Patent No.: US 10,699,963 B2
(45) Date of Patent: Jun. 30, 2020

(54) STRUCTURE AND FORMATION METHOD OF SEMICONDUCTOR DEVICE STRUCTURE WITH ISOLATION FEATURE

(71) Applicant: Taiwan Semiconductor Manufacturing Co., Ltd., Hsinchu (TW)

(72) Inventors: Tsung-Han Tsai, Zhunan Township, Miaoli County (TW); Po-Jen Wang, Taichung (TW); Chun-Li Wu, Tainan (TW); Ching-Hung Kao, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/692,072

(22) Filed: Aug. 31, 2017

(65) Prior Publication Data

US 2019/0067124 A1 Feb. 28, 2019

(51) Int. Cl.
*H01L 21/8238* (2006.01)
*H01L 21/02* (2006.01)
*H01L 29/78* (2006.01)
*H01L 21/3105* (2006.01)
*H01L 21/311* (2006.01)
(Continued)

(52) U.S. Cl.
CPC .......... *H01L 21/823814* (2013.01); *H01L 21/02579* (2013.01); *H01L 21/311* (2013.01);
(Continued)

(58) Field of Classification Search
None
See application file for complete search history.

(56) References Cited

U.S. PATENT DOCUMENTS

| 8,470,684 B2 * | 6/2013 | Pei | H01L 27/10829 438/391 |
| 9,018,754 B2 * | 4/2015 | Gambino | H01L 21/76283 257/707 |

(Continued)

OTHER PUBLICATIONS

Chinese language office action dated Feb. 19, 2019, issued in application No. TW 106135470.

*Primary Examiner* — Matthew L Reames
*Assistant Examiner* — John A Bodnar
(74) *Attorney, Agent, or Firm* — McClure, Qualey & Rodack, LLP

(57) ABSTRACT

Structures and formation methods of a semiconductor device structure are provided. The semiconductor device structure includes a substrate. The substrate includes a first semiconductor layer, a second semiconductor layer, and an insulating layer between the first semiconductor layer and the second semiconductor layer. The semiconductor device structure also includes a gate stack over the substrate. The semiconductor device structure further includes source and drain structures in the second semiconductor layer of the substrate. The source and drain structures are on opposite sides of the gate stack. In addition, the semiconductor device structure includes a first isolation feature in the substrate. The first isolation feature includes an insulation material and surrounds the source and drain structures. The semiconductor device structure also includes a second isolation feature in the first isolation feature. The second isolation feature includes a metal material and surrounds the source and drain structures.

20 Claims, 12 Drawing Sheets

(51) Int. Cl.
*H01L 21/3115* (2006.01)
*H01L 21/8234* (2006.01)
*H01L 21/762* (2006.01)
*H01L 29/16* (2006.01)
*H01L 29/51* (2006.01)
*H01L 27/088* (2006.01)
*H01L 29/165* (2006.01)

(52) U.S. Cl.
CPC .... *H01L 21/3115* (2013.01); *H01L 21/31053* (2013.01); *H01L 21/76224* (2013.01); *H01L 21/76283* (2013.01); *H01L 21/823481* (2013.01); *H01L 21/823857* (2013.01); *H01L 29/1608* (2013.01); *H01L 29/517* (2013.01); *H01L 29/7848* (2013.01); *H01L 21/823475* (2013.01); *H01L 21/823878* (2013.01); *H01L 27/088* (2013.01); *H01L 29/165* (2013.01)

(56) References Cited

U.S. PATENT DOCUMENTS

| | | |
|---|---|---|
| 2005/0156274 A1 | 7/2005 | Yeo et al. |
| 2006/0108644 A1 | 5/2006 | Chen et al. |
| 2008/0124889 A1* | 5/2008 | Roggenbauer .......... H01L 21/84 438/404 |
| 2010/0201440 A1* | 8/2010 | Nowak .................... H01L 21/84 327/581 |
| 2010/0244934 A1* | 9/2010 | Botula ............. H01L 21/76264 327/530 |
| 2012/0292705 A1* | 11/2012 | Cheng ................ H01L 27/1203 257/351 |
| 2015/0056751 A1* | 2/2015 | Zhang .................... H01L 21/78 438/113 |
| 2015/0061083 A1* | 3/2015 | Yeh .................... H01L 21/76898 257/621 |
| 2017/0110456 A1 | 4/2017 | Jeon et al. |

* cited by examiner

STRUCTURE AND FORMATION METHOD OF SEMICONDUCTOR DEVICE STRUCTURE WITH ISOLATION FEATURE

BACKGROUND

Semiconductor devices are used in a variety of electronic applications, such as personal computers, cell phones, digital cameras, and other electronic equipment. Over the past several decades, the semiconductor integrated circuit industry has experienced rapid growth. Technological advances in semiconductor materials and design have produced increasingly smaller and more complex circuits. More and more functions are integrated into electronic products. For example, different functional elements may need to be integrated together to form a mobile product of wireless communication applications.

High-frequency circuits, which form Radio Frequency (RF) devices, are widely used in mobile applications. Signal loss may be induced in a substrate that is underlying the high-frequency circuits due to parasitic capacitance between the high-frequency circuits and the underlying substrate. Semiconductor-on-insulator (SOI) technology is widely used to reduce signal loss and improve operation speed. Therefore, SOI technology is becoming increasingly important in the field of high-frequency circuits.

Although existing technology for manufacturing high-frequency circuits have generally been adequate for their intended purposes, as device scaling-down continues, they have not been entirely satisfactory in all respects. It is a challenge to form reliable high-frequency semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
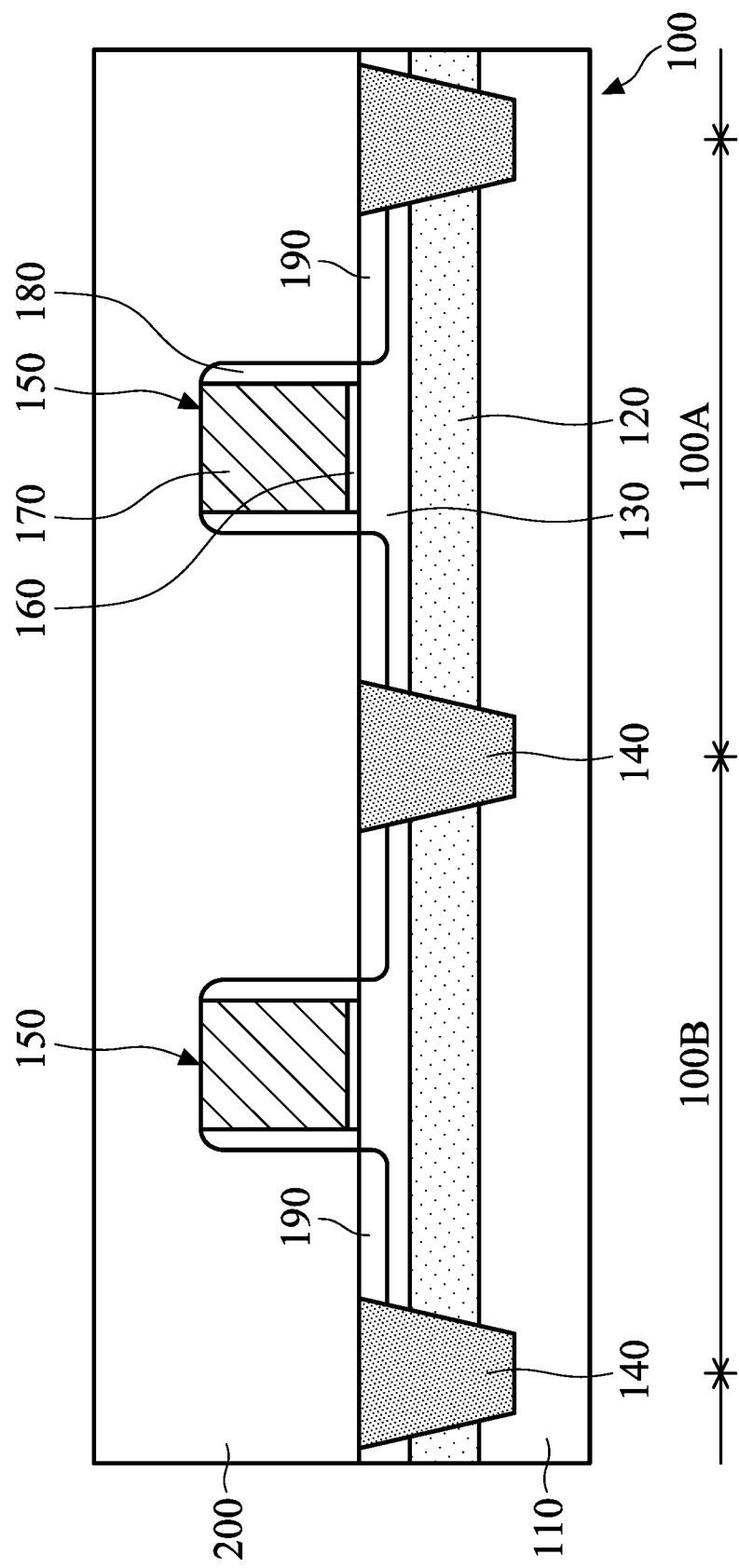
FIGS. 1A-1D are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1D are cross-sectional views of various stages of a process for forming a semiconductor device structure, in accordance with some embodiments. Additional operations can be provided before, during, and/or after the stages described in FIGS. 1A-1D. Some of the stages that are described can be replaced or eliminated for different embodiments. Additional features can be added to the semiconductor device structure. Some of the features described below can be replaced or eliminated for different embodiments.

As shown in FIG. 1A, a substrate 100 is provided. In some embodiments, the substrate 100 is a semiconductor-on-insulator (SOI) substrate or a similar substrate. The SOI substrate may be fabricated using a wafer bonding process, a silicon film transfer process, a separation by implantation of oxygen (SIMOX) process, another applicable method, or a combination thereof.

More specifically, the substrate 100 includes a semiconductor layer 110, an insulating layer 120 and a semiconductor layer 130. The semiconductor layer 110 may be referred to as a high-resistance substrate. The insulating layer 120 is between the semiconductor layer 110 and the semiconductor layer 130. In some embodiments, the semiconductor layer 110 is a semiconductor wafer, such as a silicon wafer. The insulating layer 120 includes oxide, such as thermal oxide, or another suitable material. The insulating layer 120 may be referred to as a buried oxide (BOX) layer. The semiconductor layer 130 includes silicon or another suitable semiconductor material. As a result, the substrate 100 may also be referred to as a silicon-on-insulator (SOI) substrate.

As shown in FIG. 1A, multiple isolation features including isolation features 140 are formed in the substrate 100, in accordance with some embodiments. The isolation features are used to define different regions, such as device regions (or active regions). The isolation features electrically isolate transistors or devices (which will be described in more detail later) formed in and/or over the substrate 100 in different regions. In some embodiments, the isolation features 140 penetrate through the semiconductor layer 110 and the insulating layer 120 and extend into the semiconductor layer 130. In some embodiments, the isolation features 140 include shallow trench isolation (STI) features, local oxidation of silicon (LOCOS) features, other suitable isolation features, or a combination thereof.

For example, the isolation features 140 define different regions including device regions 100A and 100B, as shown in FIG. 1A in accordance with some embodiments. Multiple transistors or devices will be formed in the device regions 100A and 100B. Examples of transistors include metal oxide semiconductor field effect transistors (MOSFET), complementary metal oxide semiconductor (CMOS) transistors, bipolar junction transistors (BJT), high voltage transistors, high-frequency transistors, p-channel and/or n channel field effect transistors (PFETs/NFETs), etc. Multiple transistors may form an RF device. Examples of RF devices in the device regions 100A and 100B may include RF switches, low noise amplifiers (LNA), power amplifiers (PA), antennas, RF transmitters, RF receivers or other suitable RF devices.

For example, in some embodiments, transistors in the device region 100A form an RF switch while transistors in the device region 100B form a LNA or a PA. In other words, multiple RF devices are integrated in the semiconductor device structure, in accordance with some embodiments of the disclosure. The isolation features 140 may separate an RF switch in the device region 100A from a LNA or a PA in the device region 100B.

Various processes, such as front-end-of-line (FEOL) semiconductor fabrication processes, are performed to form transistors in the device regions 100A and 100B. The various processes include deposition, etching, implantation, photolithography, annealing, planarization, another applicable process, or a combination thereof.

More specifically, gate stacks 150 are formed over the substrate 100 and source and drain structures 190 are formed in the substrate 100, as shown in FIG. 1A in accordance with some embodiments. The gate stacks 150 and the source and drain structures 190 form transistors in the device regions 100A and 100B.

In some embodiments, each of the gate stacks 150 includes a gate dielectric layer 160 and a gate electrode 170. In some embodiments, the gate dielectric layer 160 is made of a high-K dielectric material. Examples of high-K dielectric materials include hafnium oxide, zirconium oxide, aluminum oxide, silicon oxynitride, another suitable high-K material, and combinations thereof. In some embodiments, the gate dielectric layer 160 is deposited using an atomic layer deposition (ALD) process, a chemical vapor deposition (CVD) process, a spin-on process, another applicable process, or a combination thereof.

In some embodiments, the gate electrode 170 includes polysilicon, a metal material, another suitable conductive material, or a combination thereof. The gate electrode 170 may be a metal gate electrode. Alternatively, the gate electrode 170 may be a sacrificial/dummy gate electrode, which includes polysilicon and will be replaced with a metal gate electrode.

In some embodiments, the metal gate electrode includes metal gate stacking layers (not shown). The metal gate stacking layers may include one or more work function layers and one or more metal filling layers. Additional layers (such as a barrier layer, a blocking layer, a glue layer, or a combination thereof) can be added into the metal gate electrode. In some embodiments, the metal gate stacking layers include metal, metal carbide, metal nitride, other suitable materials, or a combination thereof. For example, the metal includes titanium, aluminum, tungsten, gold, platinum, cobalt, other suitable metals, or a combination thereof. In some embodiments, the metal gate stacking layers are deposited using an ALD process, a physical vapor deposition (PVD) process, a CVD process, an electroplating process, an electroless plating process, another applicable process, or a combination thereof.

In some embodiments, spacer elements 180 are formed over the substrate 100 and cover sidewalls of the gate stacks 150. In some embodiments, the spacer elements 180 are made of silicon nitride, silicon oxynitride, silicon carbide, silicon oxycarbide, another suitable material, or a combination thereof. In some embodiments, a spacer layer is deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the gate stacks 150 form the spacer elements 180.

The source and drain structures 190 are formed in the semiconductor layer 130 of the substrate 100. The source and drain structures 190 are on opposite sides of the gate stacks 150. The source and drain structures 190 may be used to provide stress or strain to channel regions in the semiconductor layer 130 below the gate stacks 150. As a result, the carrier mobility of the device and device performance are improved. In some embodiments, one or multiple implantation processes are performed over the substrate 100 so as to form the source and drain structures 190.

In some embodiments, the source and drain structures 190 are doped with one or more N-type or P-type dopants. The N-type dopants in the source and drain structures 190 may include nitrogen (N), phosphorus (P), arsenic (As), antimony (Sb) or other suitable dopants. The P-type dopants in the source and drain structures 190 may include boron (B), indium (In) or other suitable dopants. In some embodiments, the source and drain structures 190 have a doping concentration in a range from about 1E13 atom/cm$^3$ to about 1E15 atom/cm$^3$.

Embodiments of the disclosure are not limited thereto. In some other embodiments, the source and drain structures 190 include epitaxial structures. The substrate 100 may be partially removed to form recesses positioned at locations where the source and drain structures 190 will be formed. Afterwards, a semiconductor material is epitaxially grown in the recesses so as to form the source and drain structures 190. In some embodiments, the source and drain structures 190 include a P-type or N-type semiconductor material, such as epitaxially grown silicon, silicon-germanium (SiGe), epitaxially grown phosphorous-doped silicon (SiP), boron-doped silicon germanium (SiGeB) or another suitable epitaxially grown semiconductor material.

Subsequently, an interconnection structure is formed over the substrate 100 in the device regions 100A and 100B. The interconnection structure includes an interlayer dielectric layer (ILD), inter-metal dielectric (IMD) layers, and multiple conductive features in the ILD layer and IMD layers. The conductive features may include conductive contacts, conductive lines and/or conductive vias. The conductive features are electrically connected to the transistors including the gate stacks 150 and the source and drain structures 190. Various processes, such as back-end-of-line (BEOL) semiconductor fabrication processes, are performed to form an interconnection structure.

More specifically, a dielectric layer 200 is deposited over the substrate 100 and covers the gate stacks 150 and the source and drain structures 190, as shown in FIG. 1A in accordance with some embodiments. The dielectric layer 200 may serve as an ILD layer of an interconnection structure. In some embodiments, the dielectric layer 200 includes multiple dielectric sub-layers (not shown).

In some embodiments, the dielectric layer 200 is made of silicon oxide, silicon oxynitride, borosilicate glass (BSG), phosphoric silicate glass (PSG), borophosphosilicate glass (BPSG), fluorinated silicate glass (FSG), low-K material, porous dielectric material, another suitable dielectric material, or a combination thereof. The material of the dielectric layer 200 is selected to minimize size, propagation delays, and crosstalk between nearby conductive features. In some embodiments, the dielectric layer 200 is deposited using a CVD process, a spin-on process, a spray coating process, another applicable process, or a combination thereof.

Figure 1B:
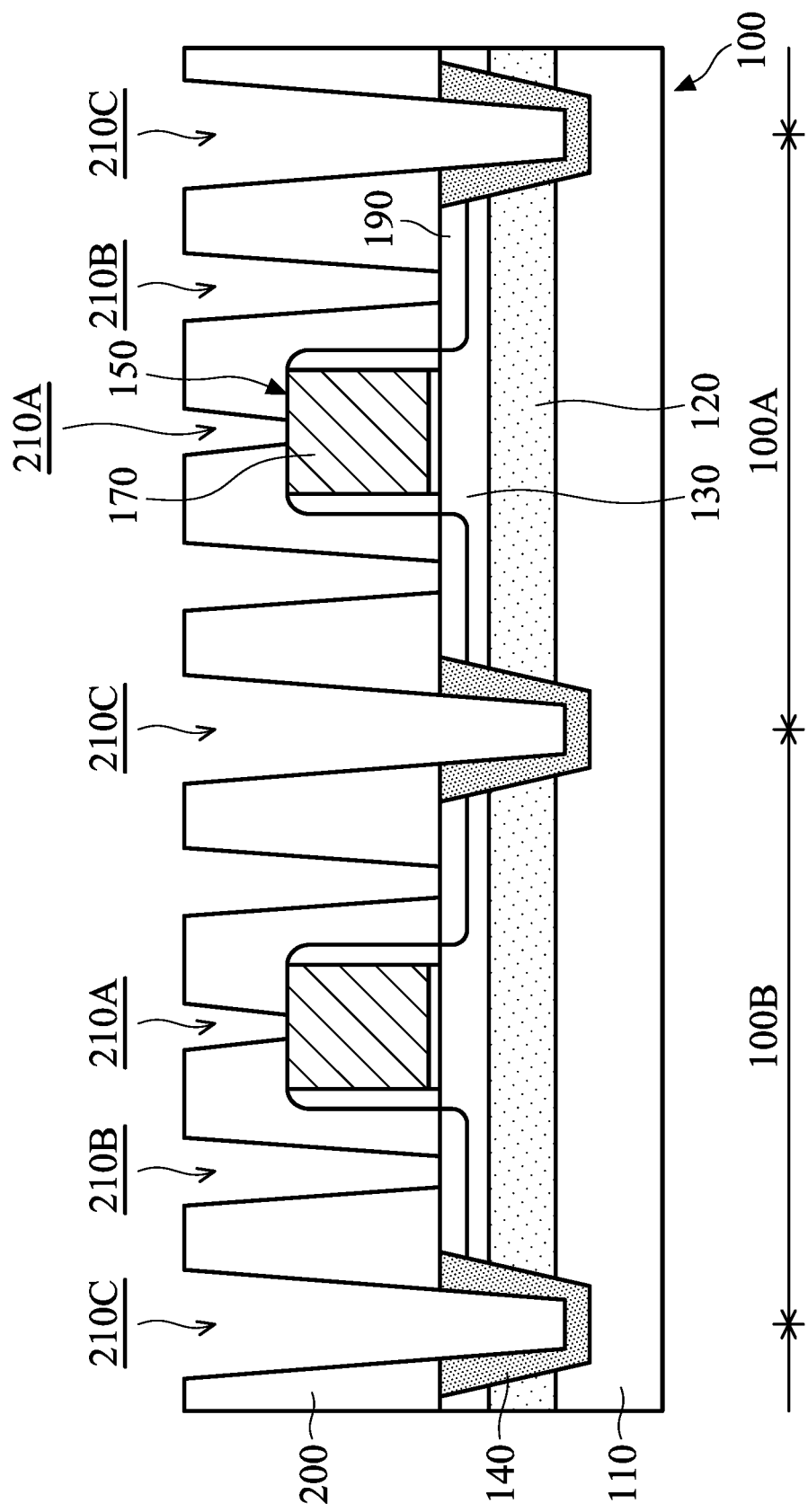

As shown in FIG. 1B, multiple openings 210A and 210B are formed in the dielectric layer 200, in accordance with some embodiments. The openings 210A and 210B are positioned at locations where conductive contacts 220A and 220B will be formed. The conductive contacts 220A and 220B will be described in more detail later.

In some embodiments, the gate stacks 150 over the substrate 100 are partially exposed from the openings 210A. In some embodiments, the openings 210B penetrate through the dielectric layer 200. As a result, the source and drain structures 190 in the substrate 100 are partially exposed from the openings 210B.

In some embodiments, an etching process is performed to partially remove the dielectric layer 200 so that the openings 210A and 210B are formed in the dielectric layer 200. In some embodiments, the etching process includes a dry etching process, a wet etching process, or another suitable etching process.

As shown in FIG. 1B, multiple trenches 210C are formed in the dielectric layer 200, in accordance with some embodiments. The trenches 210C are positioned at locations where isolation features 230 will be formed. The isolation features 230 are used to provide noise isolation and may be referred to as field plate-type isolation. The isolation features 230 will be described in more detail later.

In some embodiments, the trenches 210C penetrate through the dielectric layer 200 and extend into the isolation features 140. As a result, the isolation features 140 are partially exposed from the trenches 210C. In some embodiments, the trenches 210C do not penetrate through the isolation features 140, as shown in FIG. 1B.

In some embodiments, the openings 210A and 210B and the trenches 210C gradually shrink along a direction from the dielectric layer 200 towards the substrate 100. In some embodiments, the openings 210A and 210B and the trenches 210C are different sizes. For example, the openings 210B may be wider than the openings 210A but narrower than the trenches 210C. The openings 210B may be deeper than the openings 210A but shallower than the trenches 210C.

In some embodiments, the openings 210A and 210B and the trenches 210C have different horizontal profiles. For example, the horizontal profile of openings 210A and 210B may be relatively rounded, circular, rectangular, square, or another shape. The horizontal profile of the trenches 210C may be ring-shaped, such as a relatively rounded ring, a rectangular ring, or another shape. In some embodiments, one of the trenches 210C continuously surrounds the openings 210A and 210B. In some other embodiments, the trenches 210C discontinuously surround the openings 210A and 210B.

In some embodiments, an etching process is performed to partially remove the dielectric layer 200 and the isolation features 140 so that the trenches 210C are formed in the dielectric layer 200 and the isolation features 140. In some embodiments, the etching process includes a dry etching process, a wet etching process, or another suitable etching process. In some embodiments, the trenches 210C are formed during the formation of the openings 210A and 210B. The trenches 210C are wider than the openings 210A and 210B so that the trenches 210C are deep enough to extend into the isolation features 140. As a result, the trenches 210C are wider and deeper than the openings 210A and 210B.

However, embodiments of the disclosure are not limited thereto. In some other embodiments, the trenches 210C are formed before or after the formation of the openings 210A and 210B. The trenches 210C may not be wider than the openings 210A and 210B.

In some embodiments, the etchant for forming the openings 210A and 210B and the trenches 210C has a high etch selectivity of the dielectric layer 200 to the gate stacks 150. In other words, the dielectric layer 200 is etched much faster than the gate stacks 150. The gate stacks 150 are substantially not removed during the etching process. In some embodiments, the etchant for forming the openings 210A and 210B and the trenches 210C has a low etch selectivity of the dielectric layer 200 to the isolation features 140. Both the dielectric layer 200 and the isolation features 140 are partially removed during the etching process.

Figure 1C:
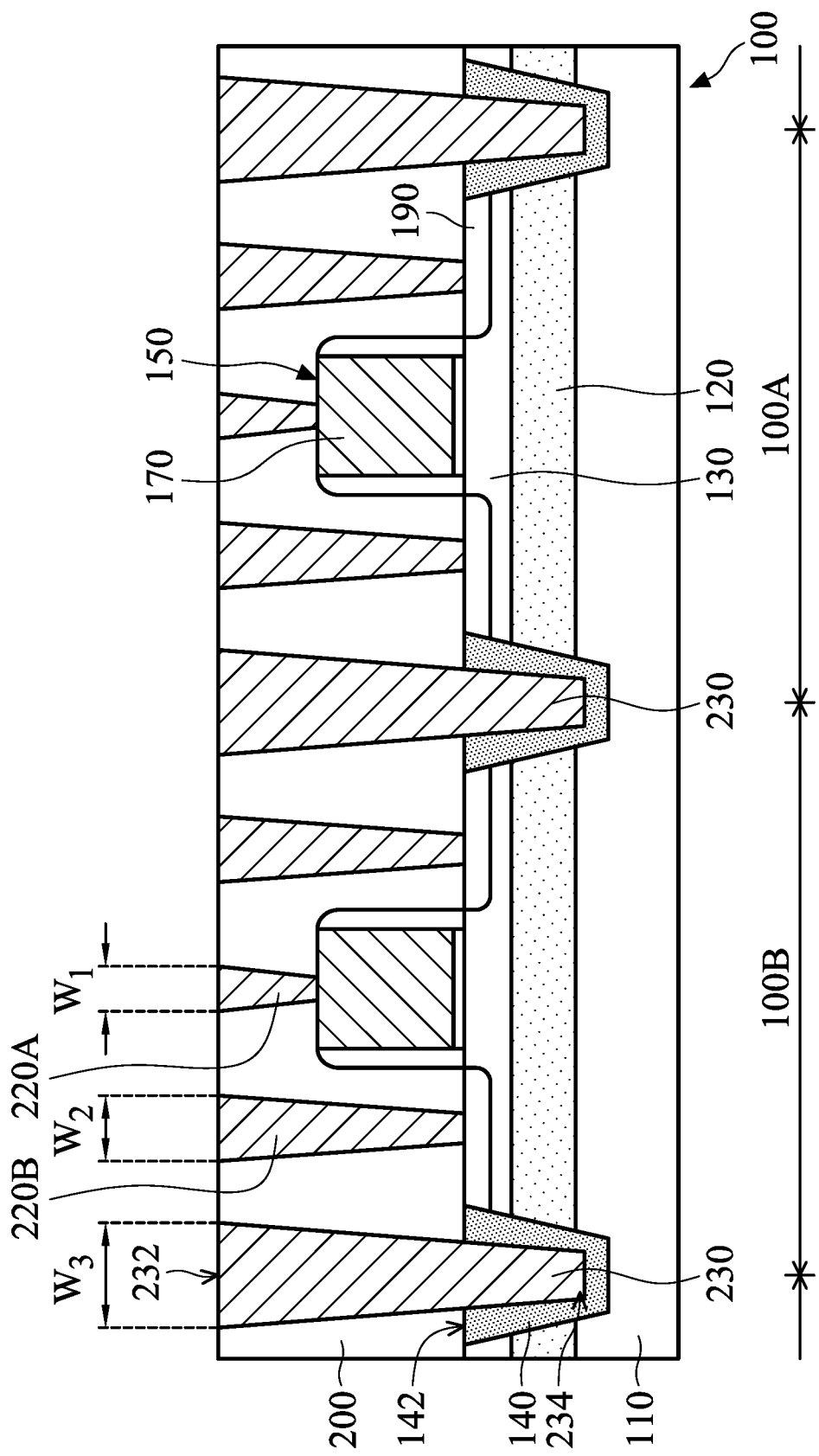

Afterwards, conductive contacts 220A and 220B and isolation features 230 are formed in the dielectric layer 200, as shown in FIG. 1C in accordance with some embodiments. In some embodiments, the conductive contacts 220A extend in the dielectric layer 200 and are electrically connected to the gate stacks 150. In some embodiments, the conductive contacts 220B penetrate through the dielectric layer 200 and are electrically connected to the source and drain structures 190.

In some embodiments, the isolation features 230 penetrate through the dielectric layer 200 and extend into the isolation features 140. As a result, the isolation features 230 is separated from the semiconductor layer 110, the insulating layer 120 and the semiconductor layer 130 by the isolation features 140. In some embodiments, the isolation features 230 are electrically isolated from the transistors including the gate stacks 150 and the source and drain structures 190. The isolation features 230 are also electrically isolated from the conductive contacts 220A and 220B. Accordingly, the isolation features 230 may be referred to as dummy features.

In some embodiments, the top surface 232 of the isolation features 230 is higher than the top surface 142 of the isolation features 140. In some embodiments, the top surface 232 of the isolation features 230 is substantially coplanar with the top surfaces of the conductive contacts 220A and 220B and the dielectric layer 200, as shown in FIG. 1C. In some embodiments, the bottom portion 234 of the isolation features 230 is enclosed by the isolation features 140, as shown in FIG. 1C.

In some embodiments, the conductive contacts 220A and 220B and the isolation features 230 gradually shrink along a direction from the dielectric layer 200 towards the substrate 100. As a result, the conductive contacts 220A and 220B and the isolation features 230 have inclined sidewalls. In some embodiments, the conductive contacts 220A and 220B and the isolation features 230 are different sizes. For example, the conductive contacts 220B may be longer than the conductive contacts 220A but shorter than the isolation features 230. The conductive contacts 220B may be wider than the conductive contacts 220A but narrower than the isolation features 230.

In some embodiments, the conductive contacts 220A have a width $W_1$ in a range from about 50 nm to about 220 nm, but embodiments of the disclosure are not limited thereto. In some embodiments, the conductive contacts 220B have a width $W_2$ in a range from about 50 nm to about 220 nm, but embodiments of the disclosure are not limited thereto. In some embodiments, the isolation features 230 have a width $W_3$ that is greater the width $W_1$ and/or the width $W_2$. In some embodiments, the width $W_3$ is about 1.2 times to about 2 times the width $W_1$ or the width $W_2$. In some embodiments, the width $W_3$ is in a range from about 60 nm to about 440 nm, but embodiments of the disclosure are not limited thereto.

In some embodiments, the isolation features 140 and the isolation features 230 have substantially the same horizontal profile. In some embodiments, the conductive contacts 220A and 220B and the isolation features 230 have different horizontal profiles. For example, the horizontal profile of the isolation features 140 and the isolation features 230 may be ring-shaped, such as a relatively rounded ring, a rectangular ring, or another shape. The horizontal profile of the conductive contacts 220A and 220B is not ring-shaped and may be relatively rounded, circular, rectangular, square, or another shape.

In some embodiments, one of the isolation features 230 continuously surrounds the conductive contacts 220A and 220B and the transistors including the gate stacks 150 and the source and drain structures 190. In some embodiments, the isolation features 230 horizontally enclose the semiconductor layer 110 and the insulating layer 120 in the device regions 100A and 100B. As a result, the isolation features 230 construct a shielding wall or barrier around the device regions 100A and 100B and between the device regions 100A and 100B.

However, embodiments of the disclosure are not limited thereto. In some other embodiments, the isolation features 230 discontinuously surround the conductive contacts 220A and 220B, the gate stacks 150 and the source and drain structures 190. The isolation features 230 partially enclose the semiconductor layer 110 and the insulating layer 120 in the device regions 100A and 100B. One of the isolation features 230 may be interrupted by a portion of the isolation features 140. In some other embodiments, the isolation features 230 are multiple discrete segments and are arranged around the device regions 100A and 100B. A portion of the isolation features 140 may be sandwiched between two of the isolation features 230.

In some embodiments, a conductive material (or multiple conductive materials) is deposited over the dielectric layer 200 and fills up the openings 210A and 210B and the trenches 210C. In some embodiments, the conductive material includes or is made of tungsten, titanium, titanium nitride (TiN), aluminum, copper, another suitable material, or a combination thereof. In some embodiments, the conductive material is deposited using a PVD process, a CVD process, an electroplating process, an electroless plating process, another applicable process, or a combination thereof.

Subsequently, a planarization process is performed to partially remove the excess conductive material outside of the openings 210A and 210B and the trenches 210C. As a result, the conductive material remaining in the openings 210A and 210B and the trenches 210C forms the conductive contacts 220A and 220B and the isolation features 230, respectively. The planarization process may include a chemical mechanical polishing (CMP) process, a grinding process, an etching process, another applicable process, or a combination thereof.

In some embodiments, the isolation features 230 include or are made of a conductive material, such as a metal material. The isolation features 230 may be referred to as metal-containing isolation features. In some embodiments, the conductive contacts 220A and 220B and the isolation features 230 include or are made of the same material. However, embodiments of the disclosure are not limited thereto. In some other embodiments, the conductive contacts 220A and 220B and the isolation features 230 include or are made of different materials. The conductive contacts 220A and 220B and the isolation features 230 may be formed in different deposition processes.

Figure 1D:
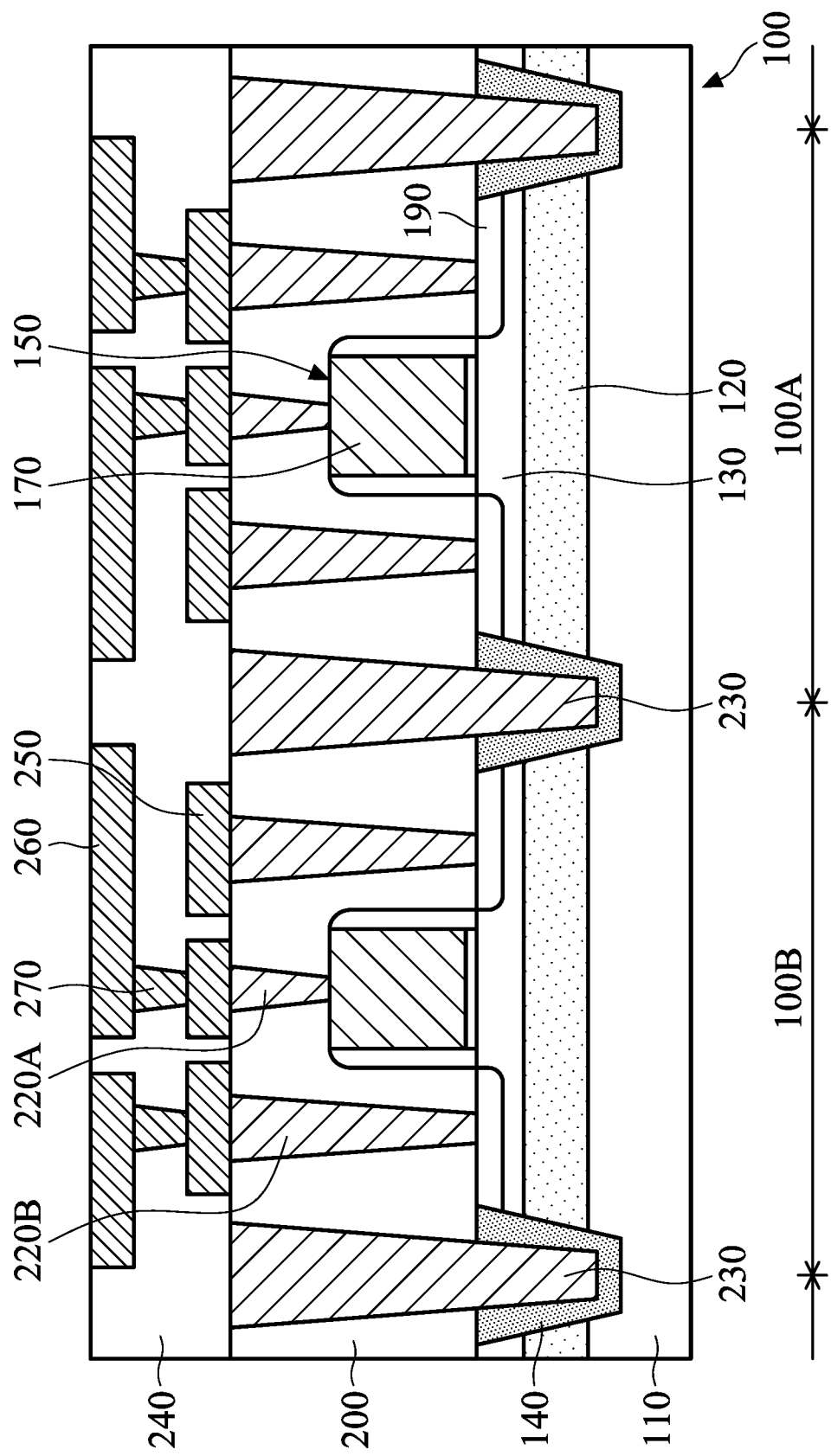

As shown in FIG. 1D, a dielectric layer 240 is deposited over the dielectric layer 200 in the device regions 100A and 100B to continue BEOL semiconductor fabrication processes, in accordance with some embodiments. The dielectric layer 240 may serve as one or more IMD layers of an interconnection structure. In some embodiments, the dielectric layer 240 includes multiple dielectric sub-layers (not shown). The dielectric layer 240 covers the conductive contacts 220A and 220B and the isolation features 230. In some embodiments, the dielectric layer 240 is in direct contact with the isolation features 230.

In some embodiments, the dielectric layer 240 is made of a low-k dielectric material. As the density of semiconductor devices increases and the size of circuit elements becomes smaller, the resistance capacitance (RC) delay time increasingly dominates circuit performance. Using a low-k dielectric material as the dielectric layer 240 is helpful for reducing the RC delay.

In some embodiments, the dielectric layer 240 includes a carbon-containing material. For example, the dielectric layer 240 includes SiOC, SiON, SiCOH, SiOCN, or a combination thereof. In some embodiments, the dielectric layer 240 is made of carbon-doped silicon oxide. The carbon-doped silicon oxide may also be referred to as organosilicate glass (OSG) or C-oxide. In some embodiments, the carbon-doped silicon oxide includes methyl silsesquioxane (MSQ), hydrogen silsesquioxane (HSQ), polysilsesquioxane, another suitable material, or a combination thereof. In some embodiments, the dielectric layer 240 is deposited using a CVD process, a spin-on process, a spray coating process, another applicable process, or a combination thereof.

As shown in FIG. 1D, conductive features 250, 260 and 270 are formed in the dielectric layer 240, in accordance with some embodiments. The conductive features 250, 260 and 270 are electrically connected to the conductive contacts 220A and 220B but electrically isolated from the isolation features 230. In some embodiments, the conductive features 250 and 260 do not overlap the isolation features 230. The conductive features 270 may or may not longitudinally overlap the isolation features 230.

In some embodiments, the conductive features 250 and 260 are conductive lines and the conductive features 270 are conductive vias, but embodiments of the disclosure are not limited thereto. The conductive features 250, 260 and 270 may be single damascene structures, dual damascene structures, or a combination thereof.

In some embodiments, the conductive features 250, 260 and 270 include or are made of copper, aluminum, tungsten, titanium, nickel, gold, platinum, silver, another suitable material, or a combination thereof. In some embodiments, one or more conductive materials for forming the conductive features 250, 260 and 270 are deposited using an electroplating process, a PVD process, a CVD process, an electroless plating process, another applicable process, or a combination thereof.

Afterwards, one or more dielectric layers and multiple conductive features are formed over the dielectric layer 240 and the conductive features 250, 260 and 270 to continue the formation of the interconnection structure. In some embodiments, the operations illustrated in FIG. 1D are repeated one or more times to continue the formation of the interconnection structure.

Figure 2:
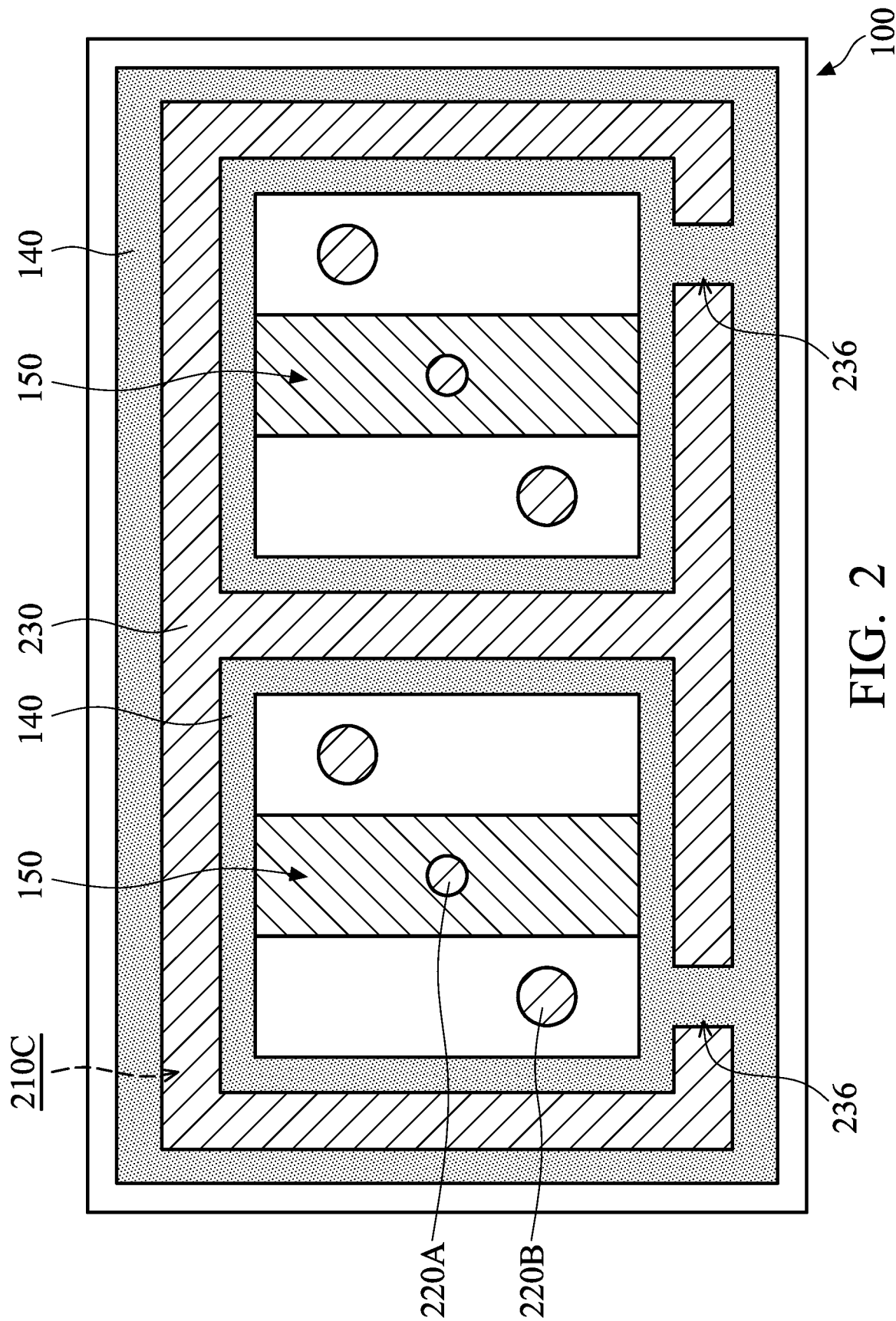
FIG. 2 is a top view of a semiconductor device structure, in accordance with some embodiments.

FIG. 2 is a top view of a semiconductor device structure, in accordance with some embodiments. In some embodiments, the structure shown in FIG. 2 is similar to or substantially the same as those shown in FIGS. 1C and 1D. For a better understanding of the structure, some features shown in FIGS. 1C and 1D are not shown in FIG. 2.

As shown in FIG. 2, the isolation features 140 are in the substrate 100 and two connected isolation features 230 are in the trenches 210C of the isolation features 140, in accordance with some embodiments. The isolation features 140 continuously surround the gate stacks 150 and separates the gate stacks 150 from each other. The isolation features 140 also surround the conductive contacts 220A and 220B. Similarly, the isolation features 230 surround the gate stacks 150 and separate the gate stacks 150 from each other. The isolation features 230 also surround the conductive contacts 220A and 220B.

In some embodiments, one of the isolation features 230 discontinuously surrounds the conductive contacts 220A and 220B, the gate stacks 150 and the source and drain structures 190. As shown in FIG. 2, each of the isolation features 230 is interrupted by a portion of the isolation features 140 so that the isolation features 230 have separated ends 236. As a result, the isolation features 230 partially enclose the conductive contacts 220A and 220B, the gate stacks 150 and the source and drain structures 190. In some embodiments, the ends 236 of the isolation features 230 are not between the gate stacks 150.

In accordance with some embodiments, the isolation features 230 are discontinuous. Accordingly, the device performance of the semiconductor device structure is prevented from being affected or reduced due to electromagnetic effect.

The layout of the isolation features 230 shown in FIG. 2 is only an example and is not a limitation to the disclosure. Many variations and/or modifications can be made to embodiments of the disclosure. In some other embodiments, the isolation features 230 are multiple discrete segments and are arranged to surround the conductive contacts 220A and 220B, the gate stacks 150 and the source and drain structures 190. For example, the isolation features 230 may include one or more rings of discrete segments (not shown). In some embodiments, all the conductive contacts 220A and 220B, the gate stacks 150 and the source and drain structures 190 are substantially laterally enclosed by the combination of all the discrete segments of the isolation features 230. In other words, all the discrete segments of the isolation features 230 together construct a shielding wall continuously surrounding the conductive contacts 220A and 220B, the gate stacks 150 and the source and drain structures 190.

In some cases, RF devices operate at high-frequency and RF current may be coupled into signals through conductive routing, device junctions, or a substrate itself. For example, RF current may be coupled through a substrate underlying the RF devices by equivalent resistance and capacitance. As a result, RF current may transmit or propagate between the RF devices through the underlying substrate even when the RF devices are at off-state. As device scaling-down continues, more RF devices with different functions, such as an RF switch, a PA or a LNA, are integrated into one chip. Insulating isolation features in an underlying substrate may not sufficiently isolate RF current between different RF devices. For example, input-signal from an antenna may transmit to a PA or LNA through the underlying substrate even when an RF switch is at off-state. Electronic noise or unwanted output-signal is induced due to RF current leakage between different RF devices.

In accordance with some embodiments, the semiconductor device structure includes isolation features 230 in the substrate 100. The isolation features 230 include a metal material and can provide noise isolation due to skin effect. Skin effect is the tendency of an alternating electric current (AC) to become distributed within a conductor such that the current density is largest near the surface of the conductor, and decreases with greater depths in the conductor. As a result of the skin effect, the isolation features 230 eliminate coupling effect in the substrate 100 and prevent RF current transmitting between the device regions 100A and 100B through the semiconductor layer 130 of the substrate 100 at off-state. The device regions 100A and 100B are well-isolated by the isolation features 230 in the substrate 100, particularly in the horizontal direction. Accordingly, better noise isolation is achieved even at off-state. The device performance of the semiconductor device structure is significantly improved.

Furthermore, the isolation features 230 are formed in the isolation features 140. Better signal isolation is achieved without enlarging the lateral distance between different RF devices, which costs the area of the semiconductor device structure. In addition, the formation of the isolation features 230 is compatible with the formation of the conductive contacts 220A and 220B without extra fabrication time and operation.

Many variations and/or modifications can be made to embodiments of the disclosure. For example, although FIG. 1D shows that the bottom portion 234 of the isolation features 230 is embedded in the isolation features 140, embodiments of the disclosure are not limited thereto. In some other embodiments, the bottom portion 234 of the isolation features 230 is not in the isolation features 140.

Figure 3:
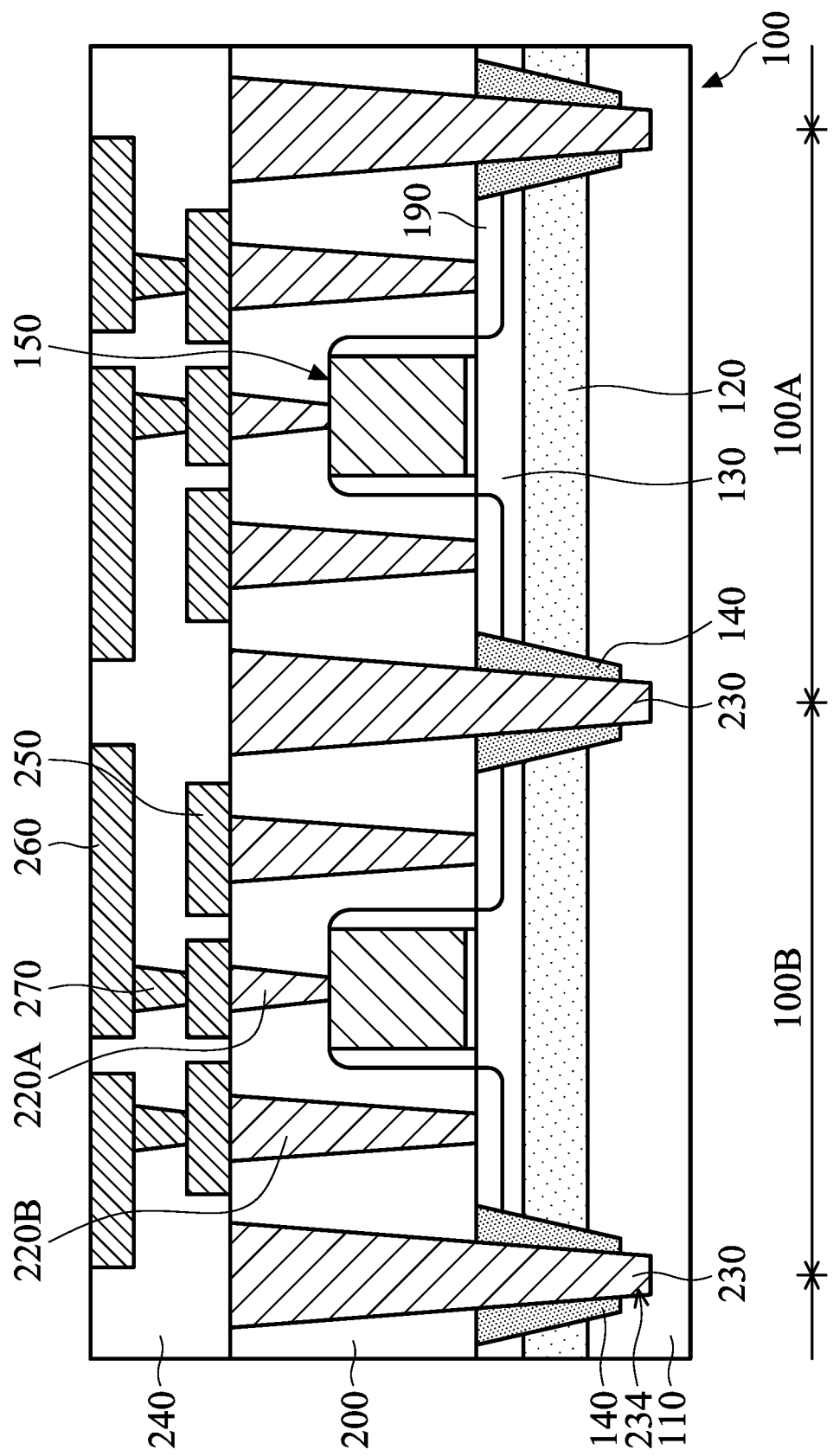
FIG. 3 is a cross-sectional view of a semiconductor device structure, in accordance with some embodiments.

FIG. 3 is a cross-sectional view of a semiconductor device structure, in accordance with some embodiments. In some embodiments, the structure shown in FIG. 3 is similar to that shown in FIG. 1D. In some embodiments, the materials and/or formation methods of the semiconductor device structure shown in FIGS. 1A-1D can also be applied in the embodiments illustrated in FIG. 3, and are therefore not repeated.

As shown in FIG. 3, the isolation features 230 penetrate through the dielectric layer 200 and the isolation features 140, in accordance with some embodiments. As a result, the isolation features 230 are in direct contact with the semiconductor layer 110 of the substrate 100. In some embodiments, the isolation features 230 extend into the semiconductor layer 110. As a result, the bottom portion 234 of the isolation features 230 is encircled by the semiconductor layer 110.

In some embodiments, the semiconductor layer 110 is partially exposed from the trenches 210C, which define the locations of the isolation features 230. In some embodiments, the semiconductor layer 110 is etched during the formation of the trenches 210C. In some embodiments, the etchant for forming the trenches 210C has a low etch selectivity of the isolation features 140 to the semiconductor layer 110. In some embodiments, the etchant for forming the trenches 210C has a low etch selectivity of the dielectric layer 200 to the semiconductor layer 110.

In some cases, during fabricating process for forming a semiconductor device structure, some charges may be accumulated in a substrate, such as a SOI substrate. For example, the charges may be induced due to one or more plasma processes. As a result, arcing and/or device-shifting problems may occur.

In accordance with some embodiments, the isolation features 230 penetrate through the isolation features 140 and extend into the semiconductor layer 110. As a result, the isolation features 230 not only provide better noise isolation but also construct one or more charge release paths in the substrate 100. Charges in the semiconductor layer 130 and/or the insulating layer 120 of the substrate 100 are reduced or substantially eliminated through the isolation features 230. Accordingly, arcing and/or device-shifting problems due to accumulated charges are prevented. Furthermore, since the isolation features 230 penetrate through the isolation features 140 and extend into the semiconductor layer 110, the isolation features 230 further provide one or more thermal conduction paths in the substrate 100. Thermal energy, which is generated during operation and accumulated in the insulating layer 120 of the substrate 100, are released and mitigated. The reliability of the semiconductor device structure is significantly enhanced.

Figure 4A:
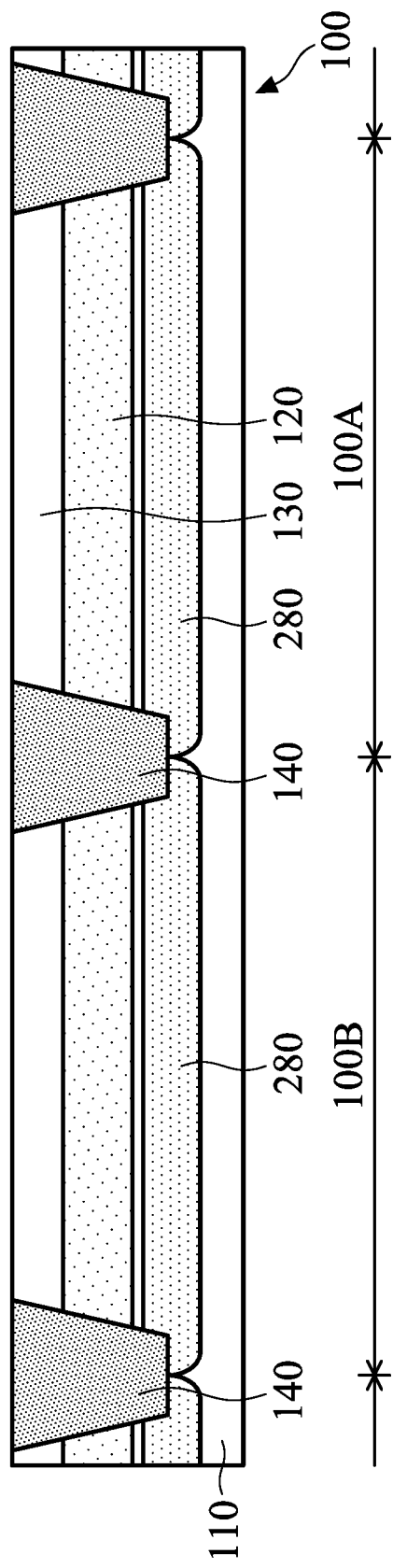
FIGS. 4A-4C are cross-sectional views of various stages of a process for forming a semiconductor device structure, in accordance with some embodiments.
Figure 4B:
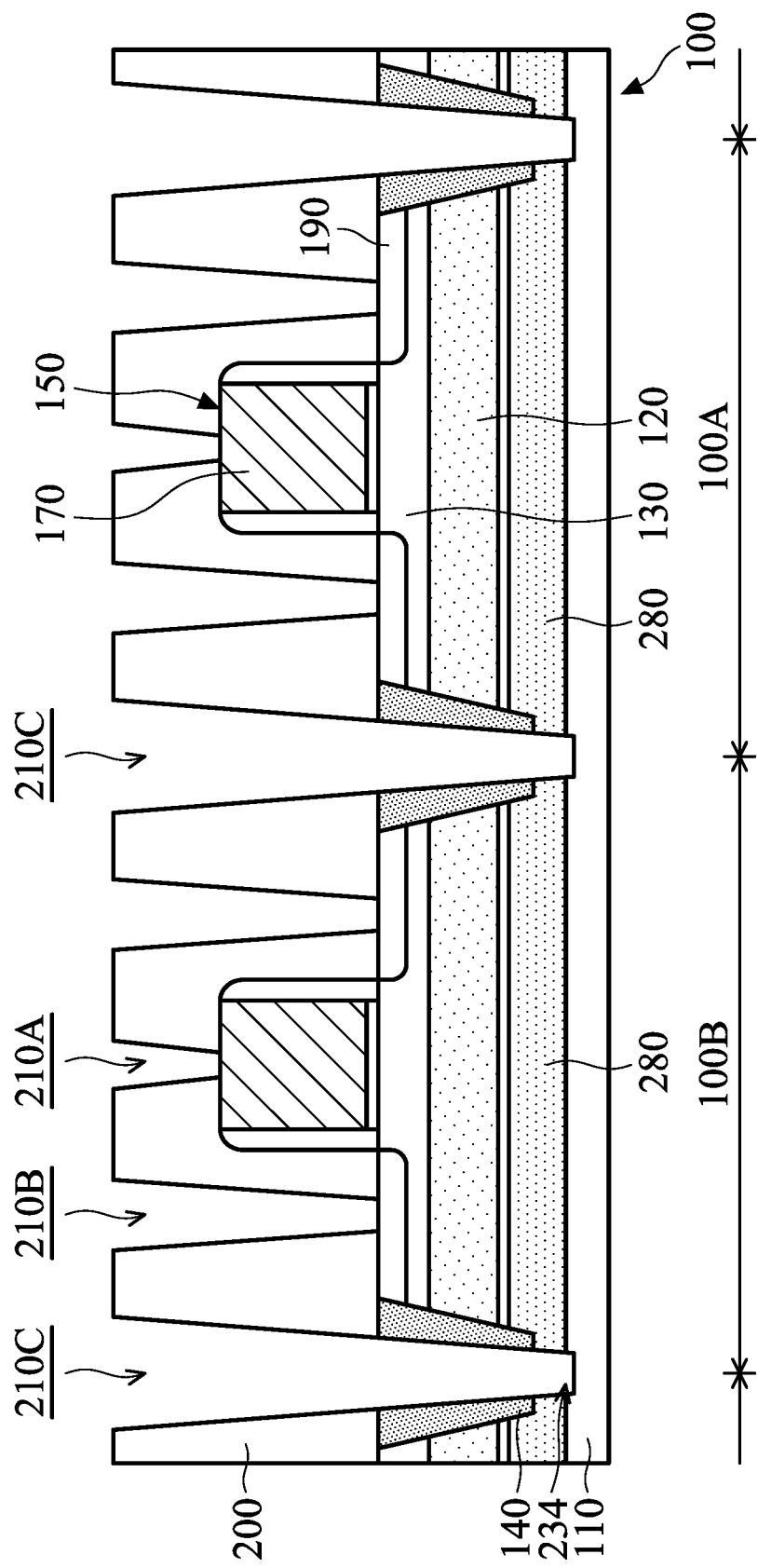
Figure 4C:
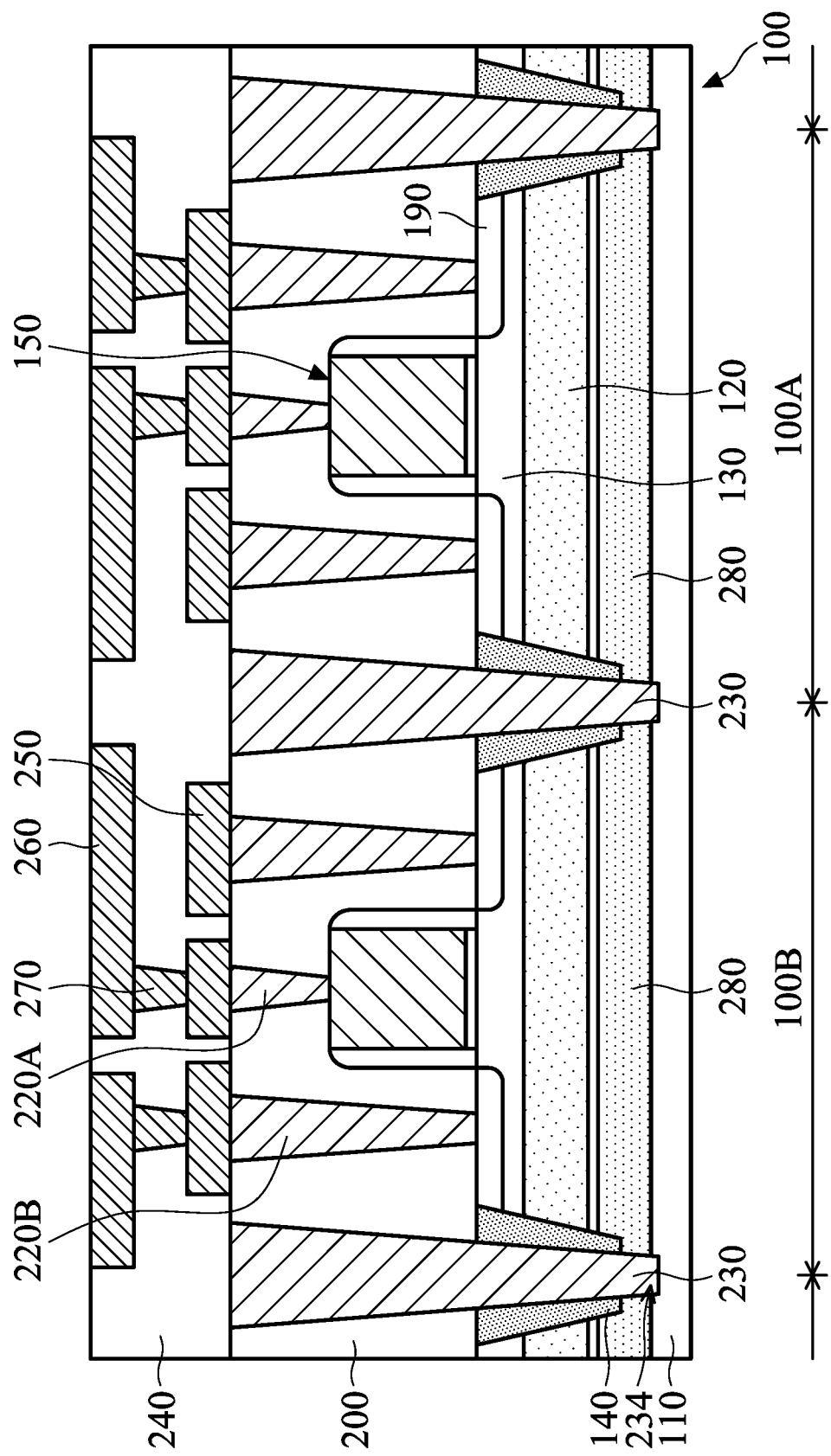

Many variations and/or modifications can be made to embodiments of the disclosure. For example, additional features can be added to the semiconductor device structure. FIGS. 4A-4C are cross-sectional views of various stages of a process for forming a semiconductor device structure, in accordance with some embodiments. In some embodiments, the structures shown in FIGS. 4A-4C are similar to those shown in FIGS. 1A-1D. In some embodiments, the materials and/or formation methods of the semiconductor device structure shown in FIGS. 1A-1D can also be applied in the embodiments illustrated in FIGS. 4A-4C, and are therefore not repeated.

As shown in FIG. 4A, multiple well regions 280 are formed in the substrate 100 before the formation of the gate stacks 150, in accordance with some embodiments. The well regions 280 are in the semiconductor layer 110 of the substrate 100. The well regions 280 may be referred to as deep well regions. In some embodiments, the well regions 280 cover and adjoin the bottom of the isolation features 140. In some embodiments, one of the well regions 280 overlaps the entire device region 100A or 100B.

In some embodiments, an implantation process is performed over the substrate 100 so as to form the well regions 280. The implantation process may be performed before or after the formation of the isolation features 140. In some embodiments, the semiconductor layer 110 is doped with N-type or P-type dopants to form the well regions 280. The N-type dopants in the well regions 280 may include N, P, As, Sb or other suitable dopants. The P-type dopants in the well regions 280 may include B, In or other suitable dopants. In some embodiments, the well regions 280 have a doping concentration in a range from about 1E12 atom/cm$^3$ to about 1E15 atom/cm$^3$. The doping concentration of the well regions 280 may be less than the doping concentration of the source and drain structures 190.

In some embodiments, the well regions 280 containing N-type dopants are separated from the insulating layer 120 of the substrate 100, as shown in FIG. 4A. For example, the well regions 280 are separated from the insulating layer 120 by a distance in a range from about 10 nm to about 1 μm, but embodiments of the disclosure are not limited thereto. In some other embodiments, the well regions 280 containing P-type dopants adjoin the insulating layer 120. However, the well regions 280 containing P-type dopants may be separated from the insulating layer 120.

In some embodiments, the dopants in the well regions 280 and the material of the isolation features 230 are selected to form a low or minimized potential barrier between the well regions 280 and the isolation features 230 connected thereto. As a result, the well regions 280 and the isolation features 230 together construct charge release paths in the substrate 100.

Afterwards, the steps described in FIGS. 1A and 1B are performed over the structure shown in FIG. 4A. As a result, the well regions 280 are partially exposed from the trenches 210C, which define the locations of the isolation features 230, as shown in FIG. 4B in accordance with some embodiments. In some embodiments, the semiconductor layer 110 is also partially exposed from the trenches 210C.

In some embodiments, the well regions 280 are etched during the formation of the trenches 210C. The trenches 210C extend into the well regions 280. In some embodiments, the semiconductor layer 110 is also etched during the formation of the trenches 210C. The trenches 210C penetrate through the well regions 280 and further extend into the semiconductor layer 110. However, embodiments of the disclosure are not limited thereto. The trenches 210C may not penetrate through the well regions 280. The trenches 210C may not extend into the semiconductor layer 110.

Afterwards, the steps described in FIGS. 1C and 1D are performed over the structure shown in FIG. 4B. As a result, the isolation features 230 are connected to the well regions 280, as shown in FIG. 4C in accordance with some embodiments. In some embodiments, the bottom portion 234 of the isolation features 230 is surrounded by the well regions 280 and the semiconductor layer 110, as shown in FIG. 4C.

Similar to the structure shown in FIG. 3, the isolation features 230 shown in FIG. 4C not only provide better provide noise shielding but also construct thermal and charge release paths in the substrate 100. Furthermore, RF current, thermal and charge can be released through the well regions 280 in the substrate 100. As a result, the well regions 280 construct additional noise, thermal and charge release paths in the substrate 100. The isolation features 230 and the well regions 280 together form charge release paths and thermal conduction paths in the substrate 100. The combination of the well regions 280 and the isolation features 230 provides improved noise isolation and shielding in both the horizontal and longitudinal directions. Accordingly, noise interference through the substrate 100, particularly through the semiconductor layer 130, between the device regions 100A and 100B is reduced or substantially eliminated.

Many variations and/or modifications can be made to embodiments of the disclosure. For example, although FIGS. 1A-1D, 3 and 4A-4C show that the isolation features 230 are formed after the formation of the gate stacks 150, embodiments of the disclosure are not limited thereto. In some other embodiments, the isolation features 230 are formed before the formation of the gate stacks 150.

Figure 5A:
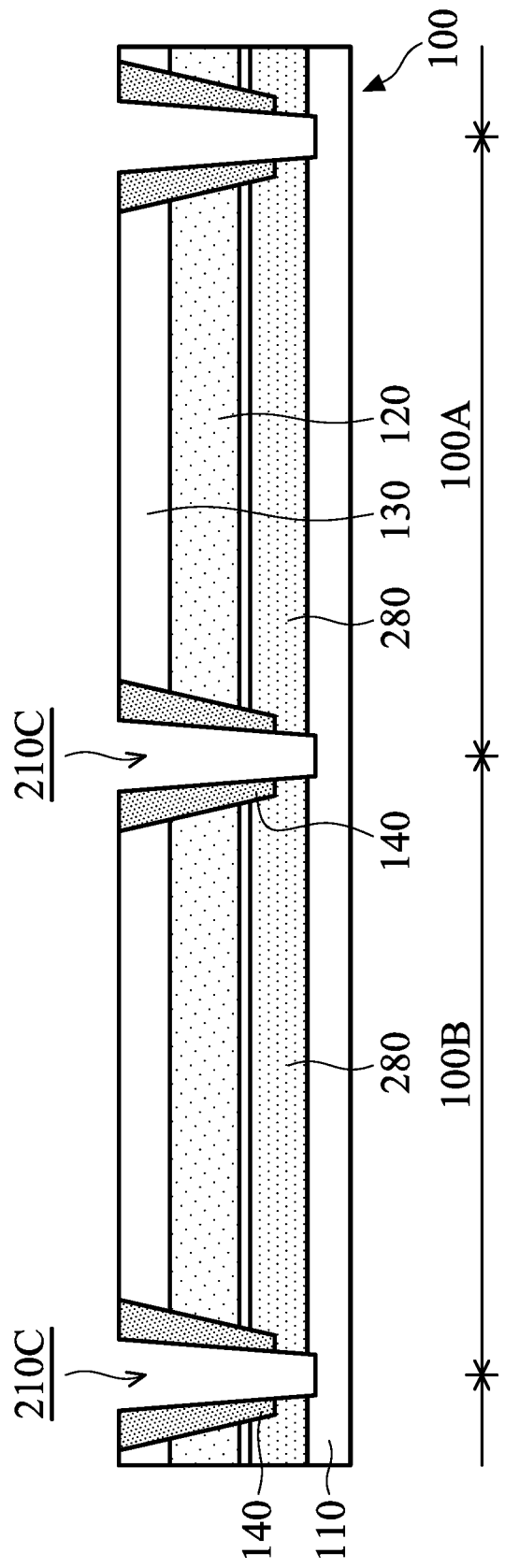
FIGS. 5A-5C are cross-sectional views of various stages of a process for forming a semiconductor device structure, in accordance with some embodiments.
Figure 5B:
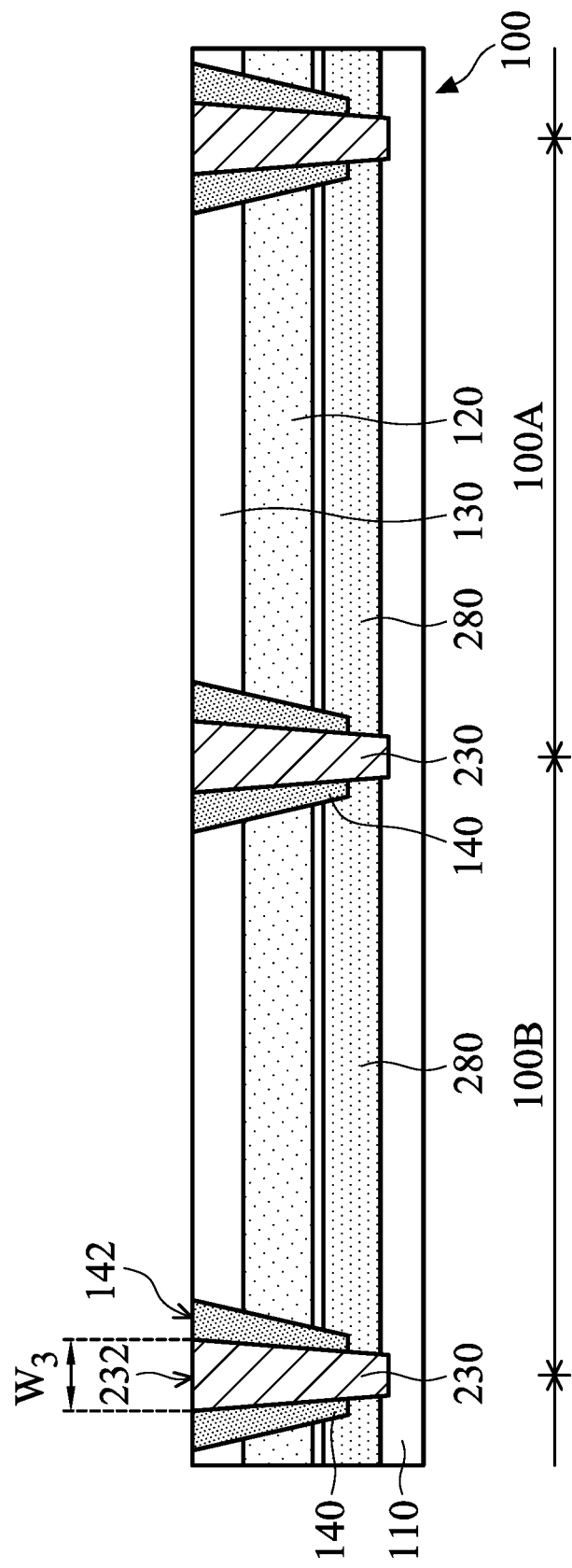
Figure 5C:
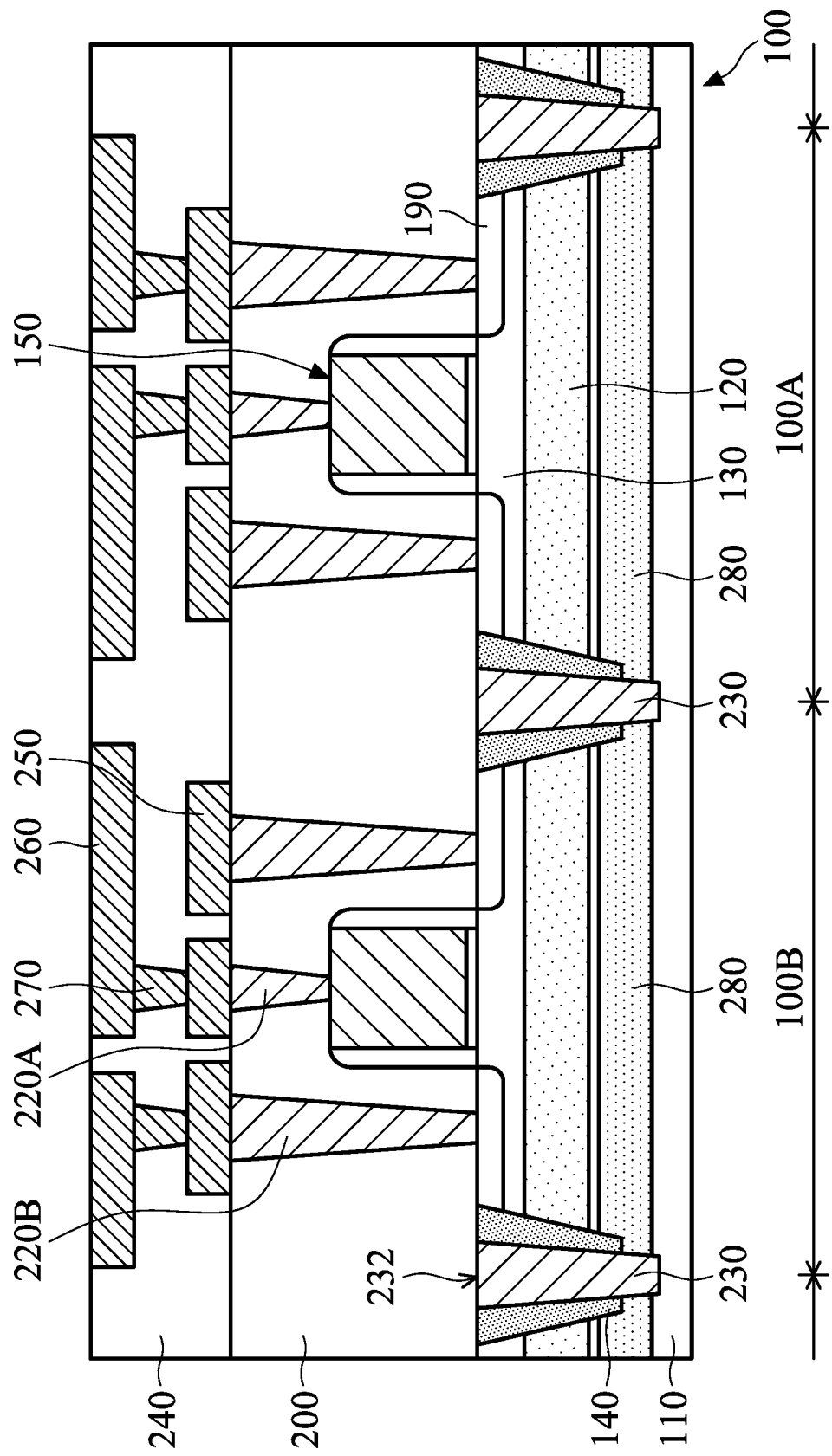

FIGS. 5A-5C are cross-sectional views of various stages of a process for forming a semiconductor device structure, in accordance with some embodiments. In some embodiments, the structures shown in FIGS. 5A-5C are similar to those shown in FIGS. 1A-1D and 4A-4C. In some embodiments, the materials and/or formation methods of the semiconductor device structure shown in FIGS. 1A-1D and 4A-4C can also be applied in the embodiments illustrated in FIGS. 5A-5C, and are therefore not repeated.

As shown in FIG. 5A, multiple trenches 210C are formed in the substrate 100 after the formation of the well regions 280, in accordance with some embodiments. The trenches 210C penetrate through the isolation features 140 and extend into the well regions 280. In some embodiments, the trenches 210C penetrate through the isolation features 140 and the well regions 280 and extend into the semiconductor layer 110. In some embodiments, the trenches 210C gradually shrink along a direction from the semiconductor layer 130 towards the semiconductor layer 110.

Afterwards, the isolation features 230 are formed in the trenches 210C, as shown in FIG. 5B in accordance with some embodiments. In some embodiments, a portion of the isolation features 140 is sandwiched between the isolation features 230 and the semiconductor layer 110. A portion of the isolation features 140 is sandwiched between the isolation features 230 and the insulating layer 120. A portion of the isolation features 140 is sandwiched between the isolation features 230 and the well regions 280. In some embodiments, the top surface 232 of the isolation features 230 is substantially coplanar with the top surface 142 of the isolation features 140, as shown in FIG. 5B.

In some embodiments, a conductive material is deposited and fills up the trenches 210C. In some embodiments, the conductive material includes or is made of tungsten, titanium, TiN, aluminum, copper, another suitable material, or a combination thereof. In some embodiments, the conductive material is deposited using a PVD process, a CVD process, an electroplating process, an electroless plating process, another applicable process, or a combination thereof. Subsequently, a planarization process may be performed to partially remove the excess conductive material outside of the trenches 210C. As a result, the conductive material remaining in the trenches 210C forms the isolation features 230.

Afterwards, the steps described in FIGS. 1A-1D are performed over the structure shown in FIG. 5B. As a result, the dielectric layer 200 covers and adjoins the isolation features 230, as shown in FIG. 5C in accordance with some embodiments. In some embodiments, the isolation features 230 are separated from the dielectric layer 240 by the dielectric layer 200.

The conductive contacts 220A and 220B are formed in the dielectric layer 200 after the formation of the isolation features 230. In some embodiments, the top surface 232 of the isolation features 230 is lower than the top surfaces of the conductive contacts 220A and 220B and the dielectric layer 200, as shown in FIG. 5C. In some embodiments, the conductive contacts 220A and 220B and the isolation features 230 are different sizes. For example, the conductive contacts 220B may be wider than the conductive contacts 220A but narrower than the isolation features 230. The conductive contacts 220B may be longer than the conductive contacts 220A and the isolation features 230. The conductive contacts 220A may be shorter than the isolation features 230.

In some embodiments, the conductive contacts 220A and 220B and the isolation features 230 include or are made of the same material. However, embodiments of the disclosure are not limited thereto. In some other embodiments, the conductive contacts 220A and 220B and the isolation features 230 include or are made of different materials.

Many variations and/or modifications can be made to embodiments of the disclosure. For example, although FIG. 5C show that the isolation features 230 penetrate through the isolation features 140 and extend into the well regions 280, embodiments of the disclosure are not limited thereto. In some other embodiments, the well regions 280 are not formed. The isolation features 230, which are formed before the formation of the gate stacks 150, penetrate through the isolation features 140 and extend into the semiconductor layer 110. In some other embodiments, the bottom portion 234 of the isolation features 230, which are formed before the formation of the gate stacks 150, is embedded in the isolation features 140. The isolation features 230 do not adjoin the semiconductor layer 110.

Many variations and/or modifications can be made to embodiments of the disclosure. For example, although FIGS. 1D, 3, 4C and 5C show that the bottom portion 234 of the isolation features 230 is lower than the insulating layer 120 of the substrate 100, embodiments of the disclosure are not limited thereto. In some other embodiments, the bottom portion 234 of the isolation features 230 is within the insulating layer 120 or is higher than the insulating layer 120. Although FIGS. 1D, 2, 3, 4C and 5C show that the isolation features 230 are surrounded by the isolation features 140, embodiments of the disclosure are not limited thereto. In some other embodiments, the isolation features 230 are not formed in the isolation features 140. The isolation features 230 may be formed in the semiconductor layer 110, the insulating layer 120 and/or the semiconductor layer 130 without enlarging the area of the semiconductor device structure.

Embodiments of the disclosure form a semiconductor device structure having a SOI substrate or a similar substrate. The semiconductor device structure includes a metal-containing isolation feature in an insulating isolation feature. The metal-containing isolation feature suppresses coupling effect in the substrate and provides noise isolation and shielding due to skin effect. As a result, RF current is prevented from transmitting between different RF devices through the substrate at off-state. RF interference or signal cross coupling through the substrate is reduced or substantially eliminated due to the metal-containing isolation feature. It can be ensured that different RF devices are sufficiently isolated, particularly in the horizontal direction. Accordingly, the device performance of the semiconductor device structure is significantly enhanced.

In some embodiments, since the metal-containing isolation feature is in the insulating isolation feature, the metal-containing isolation feature does not cost the chip area. The metal-containing isolation feature also provides thermal and charge release paths in the substrate. Accordingly, the reliability of the semiconductor device structure is significantly enhanced.

In addition, in some embodiments, the semiconductor device structure further includes a well region in the substrate. The well region is connected to the metal-containing isolation feature. As a result, the well region constructs additional noise, thermal and charge release paths in the substrate to achieve better noise isolation and shielding.

In accordance with some embodiments, a semiconductor device structure is provided. The semiconductor device structure includes a substrate. The substrate includes a first semiconductor layer, a second semiconductor layer, and an insulating layer between the first semiconductor layer and the second semiconductor layer. The semiconductor device structure also includes a gate stack over the substrate. The semiconductor device structure further includes source and drain structures in the second semiconductor layer of the substrate. The source and drain structures are on opposite sides of the gate stack. In addition, the semiconductor device structure includes a first isolation feature in the substrate. The first isolation feature includes an insulation material and surrounds the source and drain structures. The semiconductor device structure also includes a second isolation feature in the first isolation feature. The second isolation feature includes a metal material and surrounds the source and drain structures.

In accordance with some embodiments, a semiconductor device structure is provided. The semiconductor device structure includes a shallow trench isolation (STI) feature in a substrate. The semiconductor device structure also includes a first transistor and a second transistor in and over the substrate. The STI feature separates the first transistor from the second transistor. The semiconductor device structure further includes a metal-containing isolation feature in the substrate. The metal-containing isolation feature is between the first transistor and the second transistor. The metal-containing isolation feature is electrically isolated from the first transistor and the second transistor.

In accordance with some embodiments, a method for forming a semiconductor device structure is provided. The method includes forming a first isolation feature in a substrate. The method also includes forming a transistor in and over the substrate. The first isolation feature surrounds the transistor. The method further includes etching the first isolation feature to form a trench. The trench surrounds the transistor. In addition, the method includes filling the trench with a metal material to form a second isolation feature in the first isolation feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate comprising a first semiconductor layer, a second semiconductor layer, and an insulating layer between the first semiconductor layer and the second semiconductor layer;
   a well region in the first semiconductor layer of the substrate;
   a gate stack over the substrate;
   source and drain structures in the second semiconductor layer of the substrate, wherein the source and drain structures are on opposite sides of the gate stack;
   a first isolation feature in the substrate, wherein the first isolation feature comprises an insulation material and surrounds the source and drain structures; and
   a second isolation feature in the first isolation feature, wherein the second isolation feature comprises a metal material and surrounds the source and drain structures, and wherein the second isolation feature penetrates through the first isolation feature, the well region and an interface between the well region and the first semiconductor layer.

2. The semiconductor device structure as claimed in claim 1, wherein the first isolation feature penetrates through the second semiconductor layer and the insulating layer and extends into the well region.

3. The semiconductor device structure as claimed in claim 1, further comprising:
   a first dielectric layer over the substrate, wherein the first dielectric layer covers the first isolation feature, the source and drain structures and the gate stack;
   a first conductive contact in the first dielectric layer, wherein the first conductive contact is connected to the gate stack; and
   second conductive contacts in the first dielectric layer, wherein the second conductive contacts are connected to the source and drain structures, and wherein the second isolation feature comprising the metal material is electrically isolated from the first conductive contact and the second conductive contacts.

4. The semiconductor device structure as claimed in claim 3, wherein the second isolation feature is wider than the first conductive contact and the second conductive contacts.

5. The semiconductor device structure as claimed in claim 3, further comprising:
   a second dielectric layer covering the first dielectric layer; and
   conductive features in the second dielectric layer, wherein the conductive features are electrically connected to the first conductive contact and the second conductive contacts, and wherein the second isolation feature penetrates through the first dielectric layer and adjoins the second dielectric layer.

6. A semiconductor device structure, comprising:
   a shallow trench isolation (STI) feature in a substrate, wherein the substrate comprises a first semiconductor layer, a second semiconductor layer over the first semiconductor layer, and an insulating layer between the first semiconductor layer and the second semiconductor layer;
   a first transistor and a second transistor in and over the substrate, wherein the STI feature separates the first transistor from the second transistor; and
   a metal-containing isolation feature in the substrate, wherein the metal-containing isolation feature is between the first transistor and the second transistor, and wherein the metal-containing isolation feature is electrically isolated from the first transistor and the second transistor, and a bottom surface of the metal-containing isolation feature is higher than a bottom surface of the STI feature, and the bottom surface of the metal-containing isolation feature is lower than a bottom surface of the insulating layer.

7. The semiconductor device structure as claimed in claim 6, wherein the STI feature separates the metal-containing isolation feature from the second semiconductor layer and the insulating layer.

8. The semiconductor device structure as claimed in claim 7, wherein the metal-containing isolation feature is in the STI feature and has a bottom portion embedded in the first semiconductor layer.

9. The semiconductor device structure as claimed in claim 6, further comprising:
   conductive contacts electrically connected to the first transistor and the second transistor, wherein the metal-containing isolation feature extends in and over the STI feature, and wherein the metal-containing isolation feature surrounds the conductive contacts.

10. The semiconductor device structure as claimed in claim 6, wherein the STI feature has a first top surface and the metal-containing isolation feature has a second top surface, and wherein the second top surface is substantially coplanar with the first top surface.

11. The semiconductor device structure as claimed in claim 6, further comprising:
   a well region in the substrate, wherein the well region and the metal-containing isolation feature are separated by the STI feature.

12. A semiconductor device structure, comprising:
a plurality of gate stacks over a substrate, wherein the substrate comprises a first semiconductor layer, a second semiconductor layer over the first semiconductor layer, and an insulating layer between the first semiconductor layer and the second semiconductor layer;
a well region in the first semiconductor layer of the substrate;
a plurality of source and drain structures in the second semiconductor layer of the substrate;
a plurality of shallow trench isolation (STI) features formed in the substrate and continuously surrounding the plurality of gate stacks; and
a plurality of metal-containing isolation features formed in the plurality of STI features and discontinuously surrounding the plurality of gate stacks,
wherein each of the plurality of metal-containing isolation features is interrupted by a portion of the plurality of STI features, so that the plurality of metal-containing isolation features has separated ends, and
wherein the plurality of metal-containing isolation features is spaced apart and electrically isolated from the plurality of gate stacks by the plurality of STI features, and a bottom surface of each of the plurality of metal-containing isolation features is lower than a bottom surface of the well region.

13. The semiconductor device structure as claimed in claim 12, further comprising:
a first dielectric layer over the substrate and covering the plurality of gate stacks and the plurality of STI features, wherein the plurality of metal-containing isolation features extends into the first dielectric layer.

14. The semiconductor device structure as claimed in claim 13, further comprising:
a second dielectric layer covering the first dielectric layer; and
conductive features in the second dielectric layer, wherein the conductive features are electrically connected to the plurality of gate stacks, and wherein the plurality of metal-containing isolation features adjoins the second dielectric layer.

15. The semiconductor device structure as claimed in claim 12, wherein the separated ends are not between two adjacent gate stacks of the plurality of the gate stacks.

16. The semiconductor device structure as claimed in claim 1, wherein a bottom surface of the second isolation feature is between the a bottom surface of the well region and a bottom surface of the first semiconductor layer.

17. The semiconductor device structure as claimed in claim 16, wherein sidewalls and the bottom surface of the second isolation feature are in contact with the first semiconductor layer.

18. The semiconductor device structure as claimed in claim 1, wherein a doping concentration of the well region is less than a doping concentration of the source and drain structures.

19. The semiconductor device structure as claimed in claim 6, wherein the STI feature has a continuous tapered outline from a topmost surface of the STI feature to a bottommost surface of the STI feature.

20. The semiconductor device structure as claimed in claim 12, wherein a sidewall and the bottom of each of the plurality of metal-containing isolation features are in contact with the first semiconductor layer.

* * * * *